United States Patent
Lee et al.

(10) Patent No.: US 10,164,574 B2
(45) Date of Patent: Dec. 25, 2018

(54) METHOD FOR GENERATING A PLURALITY OF OSCILLATING SIGNALS WITH DIFFERENT PHASES AND ASSOCIATED CIRCUIT AND LOCAL OSCILLATOR

(71) Applicant: MEDIATEK INC., Hsin-Chu (TW)

(72) Inventors: Yueh-Ting Lee, New Taipei (TW); Yao-Chi Wang, Hsinchu (TW); Sheng-Che Tseng, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 155 days.

(21) Appl. No.: 15/098,307

(22) Filed: Apr. 13, 2016

(65) Prior Publication Data

US 2017/0012584 A1  Jan. 12, 2017

Related U.S. Application Data

(60) Provisional application No. 62/189,358, filed on Jul. 7, 2015.

(51) Int. Cl.
| | |
|---|---|
| *H03B 27/00* | (2006.01) |
| *H03L 7/081* | (2006.01) |
| *H03K 5/14* | (2014.01) |
| *H03K 21/02* | (2006.01) |
| *H03L 7/00* | (2006.01) |
| *H03K 5/00* | (2006.01) |

(52) U.S. Cl.
CPC .............. *H03B 27/00* (2013.01); *H03K 5/14* (2013.01); *H03K 21/02* (2013.01); *H03L 7/00* (2013.01); *H03L 7/0812* (2013.01); *H03K 2005/00234* (2013.01)

(58) Field of Classification Search
CPC ......... H03B 19/00; H03B 27/00; H03L 7/081; H03L 7/00; H03L 7/0812; H03K 19/21; H03K 21/02; H03K 5/14
USPC ........ 327/276, 115; 331/57, 1 A, 10; 377/48
See application file for complete search history.

(56) References Cited

U.S. PATENT DOCUMENTS

| | | | |
|---|---|---|---|
| 7,825,703 B2 | 11/2010 | Qiao et al. | |
| 8,816,780 B2 * | 8/2014 | Wang | H03L 7/0996 331/10 |

(Continued)

FOREIGN PATENT DOCUMENTS

| | | |
|---|---|---|
| EP | 1 158 679 A1 | 11/2001 |
| WO | 2006033583 A2 | 3/2006 |

*Primary Examiner* — Arnold Kinkead
(74) *Attorney, Agent, or Firm* — Winston Hsu

(57) ABSTRACT

A circuit for generating a plurality of oscillating signals with different phases includes a frequency divider, a first delay chain, a second delay chain and a calibration circuit. The frequency divider is arranged for frequency dividing a first input signal and a second input signal to generate a first frequency-divided input signal and a second frequency-divided input signal. The first delay chain is arranged for delaying the first frequency-divided input signal, and the second delay chain is arranged for delaying the second frequency-divided input signal. The calibration circuit is arranged for controlling delay amounts of the first delay chain and the second delay chain according to signals within the first delay chain or the second delay chain; wherein output signals of a portion delay cells within the first delay chain and the second delay chain serve as the plurality of oscillating signals with different phases.

26 Claims, 10 Drawing Sheets

(56) References Cited

U.S. PATENT DOCUMENTS

| | | |
|---|---|---|
| 2002/0039052 A1 | 4/2002 | Straub |
| 2008/0002788 A1 | 1/2008 | Akhtar |
| 2011/0084750 A1* | 4/2011 | Kobayashi ............ H03H 11/265 |
| | | 327/276 |
| 2013/0127501 A1* | 5/2013 | Chen ....................... H03L 7/081 |
| | | 327/115 |
| 2014/0184281 A1* | 7/2014 | Danny .................... H03L 7/081 |
| | | 327/115 |
| 2015/0180643 A1 | 6/2015 | Shi |
| 2016/0118962 A1* | 4/2016 | Tseng ..................... H03K 19/21 |
| | | 327/115 |

* cited by examiner

METHOD FOR GENERATING A PLURALITY OF OSCILLATING SIGNALS WITH DIFFERENT PHASES AND ASSOCIATED CIRCUIT AND LOCAL OSCILLATOR

CROSS REFERENCE TO RELATED APPLICATIONS

This application claims the priority of U.S. Provisional Application No. 62/189,358, filed on Jul. 7, 2015, which is included herein by reference in its entirety.

BACKGROUND

In some applications of a local oscillator, clock signals outputted from a phase-locked loop (PLL) are suggested to be frequency divided by a divider having an odd divisor (e.g. 3). However, an output of this odd number frequency divider does not have quadrature information, so how to build a novel local oscillator to generate accurate quadrature outputs while using the odd number frequency divider is an important topic.

SUMMARY

It is therefore an objective of the present invention to provide a method for generating a plurality of oscillating signals with different phases and associated circuit and local oscillator, which can use a simple structure to generate accurate quadrature outputs.

According to one embodiment of the present invention, a circuit for generating a plurality of oscillating signals with different phases comprises a frequency divider, a first delay chain, a second delay chain and a calibration circuit. The frequency divider is arranged for frequency dividing a first input signal and a second input signal to generate a first frequency-divided input signal and a second frequency-divided input signal. The first delay chain comprises a plurality of first delay cells connected in series, and is arranged for receiving the first frequency-divided input signal. The second delay chain comprises a plurality of second delay cells connected in series, and is arranged for receiving the second frequency-divided input signal. The calibration circuit is coupled to the first delay chain and the second delay chain, and is arranged for controlling delay amounts of the first delay chain and the second delay chain according to signals within the first delay chain or the second delay chain; wherein output signals of a portion of the first delay cells and the second delay cells serve as the plurality of oscillating signals with different phases.

According to another embodiment of the present invention, a local oscillator for generating a plurality of oscillating signals with different phases comprises a frequency divider, a first delay chain, a second delay chain and a calibration circuit. The frequency divider is arranged for frequency dividing a first input signal and a second input signal to generate a first frequency-divided input signal and a second frequency-divided input signal. The first delay chain comprises a plurality of first delay cells connected in series, and is arranged for receiving the first frequency-divided input signal. The second delay chain comprises a plurality of second delay cells connected in series, and is arranged for receiving the second frequency-divided input signal. The calibration circuit is coupled to the first delay chain and the second delay chain, and is arranged for controlling delay amounts of the first delay chain and the second delay chain according to signals within the first delay chain or the second delay chain; wherein output signals of a portion of the first delay cells and the second delay cells serve as the plurality of oscillating signals with different phases.

According to another embodiment of the present invention, a method for generating a plurality of oscillating signals with different phases comprises: frequency dividing a first input signal and a second input signal to generate a first frequency-divided input signal and a second frequency-divided input signal; using a plurality of first delay cells connected in series to delay the first frequency-divided input signal; using a plurality of second delay cells connected in series to delay the second frequency-divided input signal; controlling delay amounts of the first delay cells and the second delay cells according to at least two outputs of the first delay cells or the second delay cells; and outputting output signals of a portion of the first delay cells and the second delay cells to serve as the plurality of oscillating signals with different phases.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
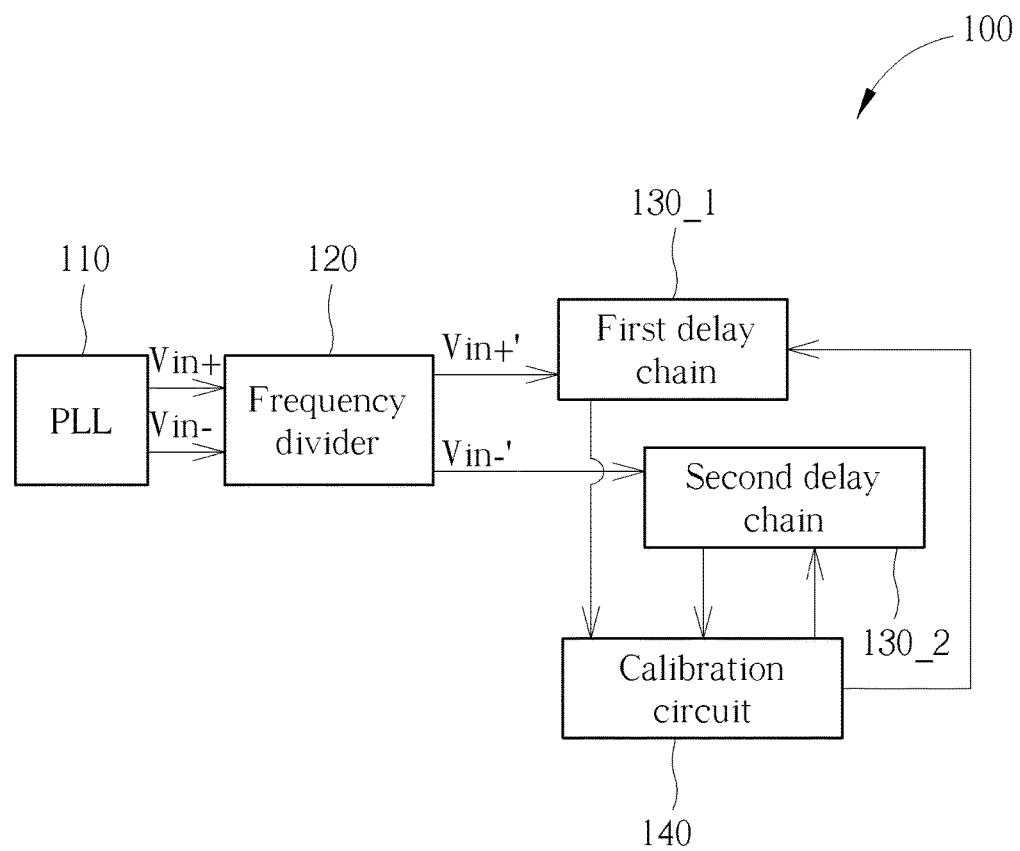
FIG. 1 is a diagram illustrating a local oscillator according to one embodiment of the present invention.

Please refer to FIG. 1, which is a diagram illustrating a local oscillator 100 according to one embodiment of the present invention. As shown in FIG. 1, the local oscillator 100 comprises a PLL 110, a frequency divider 120, a first delay chain 130_1, a second delay chain 130_2 and a calibration circuit 140. In this embodiment, the frequency divider 120 has an odd divisor (e.g. 3), and the local oscillator 100 is arranged to generate a plurality of oscillating signals with different phases, for example, without a limitation of the present invention, an in-phase signal (I+), a quadrature signal (Q+), an inverted in-phase signal (I-) and an inverted quadrature signal (Q-).

In the operations of the local oscillator 100, the PLL 110 generates two input signals Vin+ and Vin-, where the input signals Vin+ and Vin- may be clocks with 50% duty cycle, and the phase difference between the input signals Vin+ and Vin- are 180 degrees. Then the frequency divider 120 frequency divides the input signals Vin+ and Vin- by an odd number (e.g. 3) to generate frequency-divided input signals Vin+' and Vin-'. The first delay chain 130_1 delays the frequency-divided input signals Vin+', and the second delay chain 130_2 delays the frequency-divided input signals Vin-'. The calibration circuit 140 is arranged to control delay amounts of the first delay chain 130_1 and the second delay chain 130_2 according to signals within the first delay chain 130_1 and/or the second delay chain 130_2.

Figure 2:
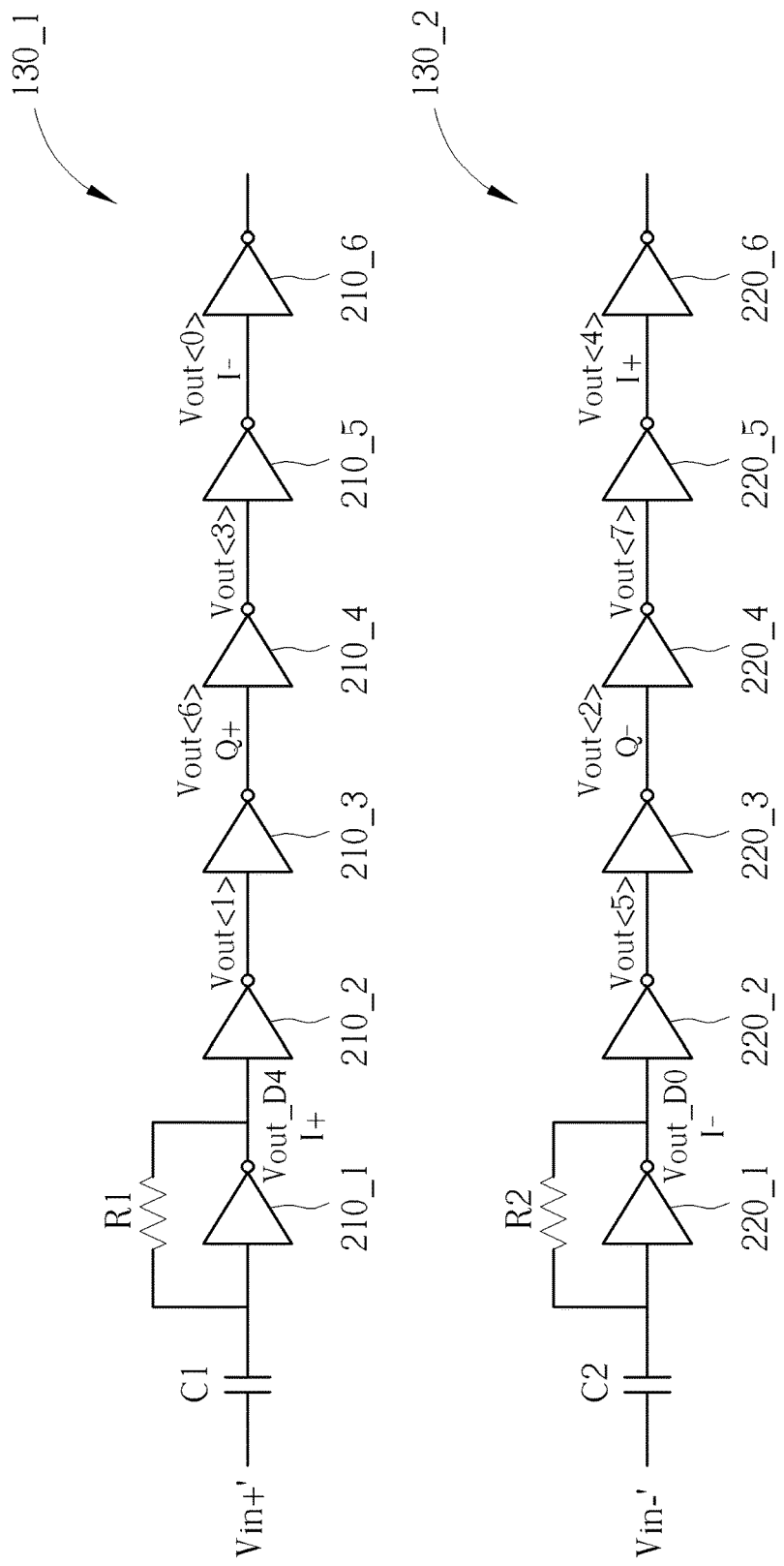
FIG. 2 is a diagram illustrating the first delay chain and the second delay chain according to one embodiment of the present invention.
Figure 3:
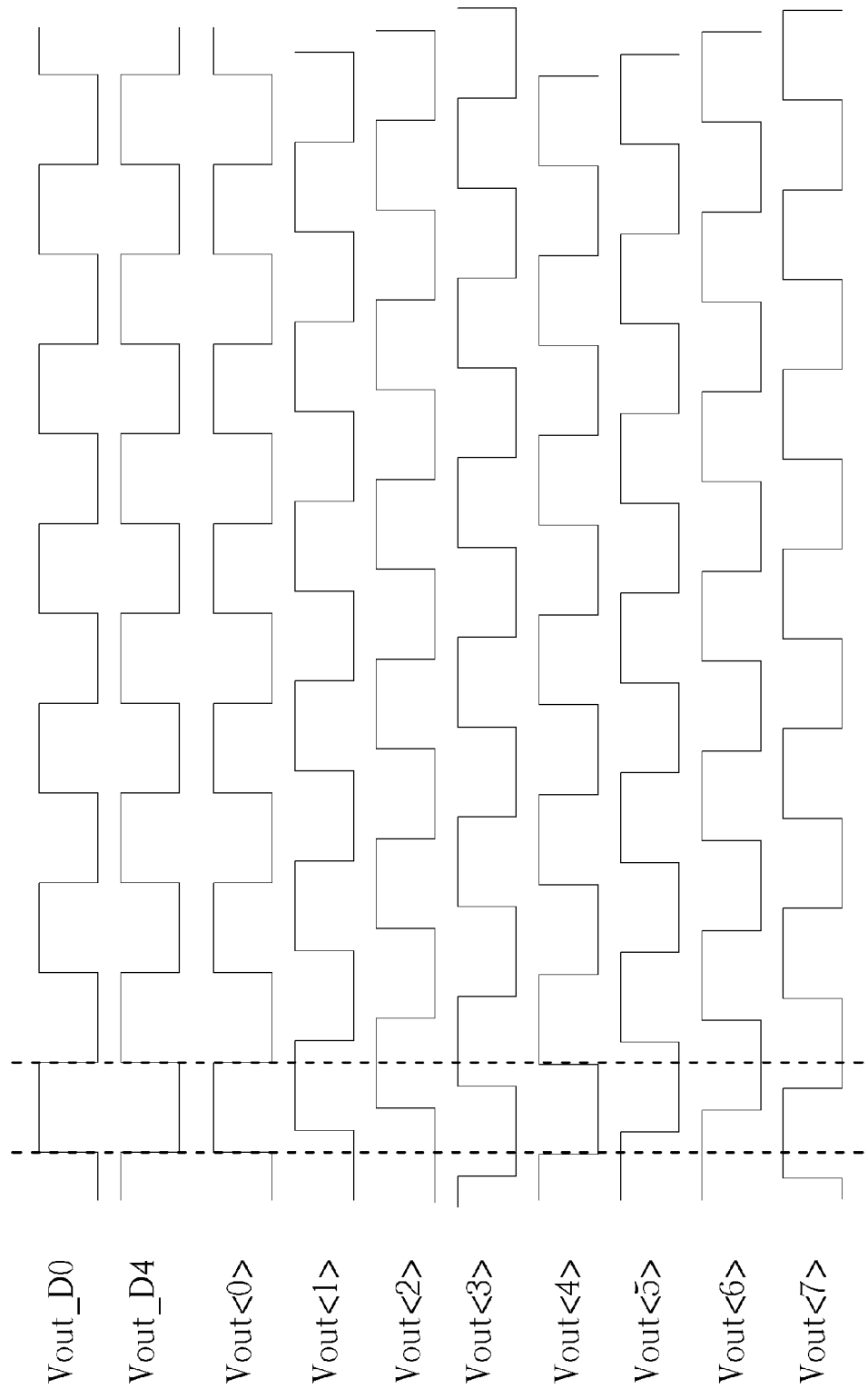
FIG. 3 shows a timing diagram of the outputs of the inverters shown in FIG. 2.

In detail, please refer to FIG. 2, which is a diagram illustrating the first delay chain 130_1 and the second delay chain 130_2 according to one embodiment of the present invention. As shown in FIG. 2, the first delay chain 130_1 comprises a plurality of delay cells connected in series (in this embodiment, the delay cells are implemented by inverters 210_1-210_6), and the delay amount of each inverter 210_1-210_6 is forty-five degrees. In addition, the second delay chain 130_2 comprises a plurality of delay cells connected in series (in this embodiment, the delay cells are implemented by inverters 220_1-220_6), and the delay amount of each inverter 220_1-220_6 is forty-five degrees. FIG. 3 shows a timing diagram of the outputs of the inverters 210_1-210_5 and 220_1-220_5, that is the timing diagram of Vout_D4, Vout<1>, Vout<6>, Vout<3>, Vout<0>, Vout_D0, Vout<5>, Vout<2>, Vout<7> and Vout<4>.

As shown in FIG. 2, the in-phase signal (I+), the quadrature signal (Q+), the inverted in-phase signal (I-) and the inverted quadrature signal (Q-) can be obtained from outputs of a portion of the inverters 210_1-210_5 and 220_1-220_5. In this embodiment, without a limitation of the present invention, the output signals Vout<4>, Vout<6>, Vout<0> and Vout<2> may serve as the in-phase signal (I+), the quadrature signal (Q+), the inverted in-phase signal (I-) and the inverted quadrature signal (Q-), respectively.

Figure 4:
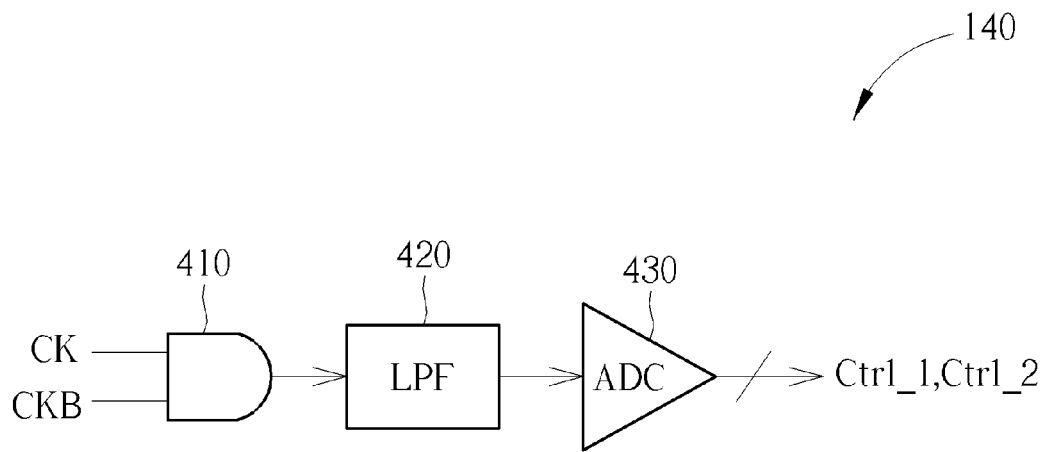
FIG. 4 is a diagram illustrating the calibration circuit according to one embodiment of the present invention.

To make the phases of the output signals Vout<4>, Vout<6>, Vout<0> and Vout<2> (i.e. I+, Q+, I-, Q-) to be accurate, the calibration circuit 140 can calibrate the delay amounts of the inverters 210_1-210_6 and 220_1-220_6 by referring to two of the outputs of the inverters 210_1-210_6 and 220_1-220_6. Refer to FIG. 4, which is a diagram illustrating the calibration circuit 140 according to one embodiment of the present invention, the calibration circuit 140 comprises an AND gate 410, a low-pass filter 420 and an analog-to-digital converter (ADC) 430. As shown in FIG. 4, the AND gate 410 receives a clock signal CK and an inverted clock signal CKB, where the clock signal CK and the inverted clock signal CKB can be any two of the outputs of the inverters 210_1-210_6 and 220_1-220_6 whose phase different should be 180 degree, for example, the clock signal CK and the inverted clock signal CKB may be Vout_D4 and Vout<0>, respectively. Then, the low-pass filter 420 filters an output of the AND gate 410 to generate a filtered signal, and the ADC 430 converts the filtered signal to generate a digital calibration signal Ctrl_1 to control the delay amounts of the inverters 210_1-210_6 within the first delay chain 130_1 to make the phase different between Vout_D4 and Vout<0> close to 180 degree. Similarly, the clock signal CK and the inverted clock signal CKB may be Vout_D0 and Vout<4>, respectively, and the ADC 430 can generate a digital calibration signal Ctrl_2 to control the delay amounts of the inverters 220_1-220_6 within the second delay chain 130_2 to make the phase different between Vout D0 and Vout<4> close to 180 degree.

Figure 5:
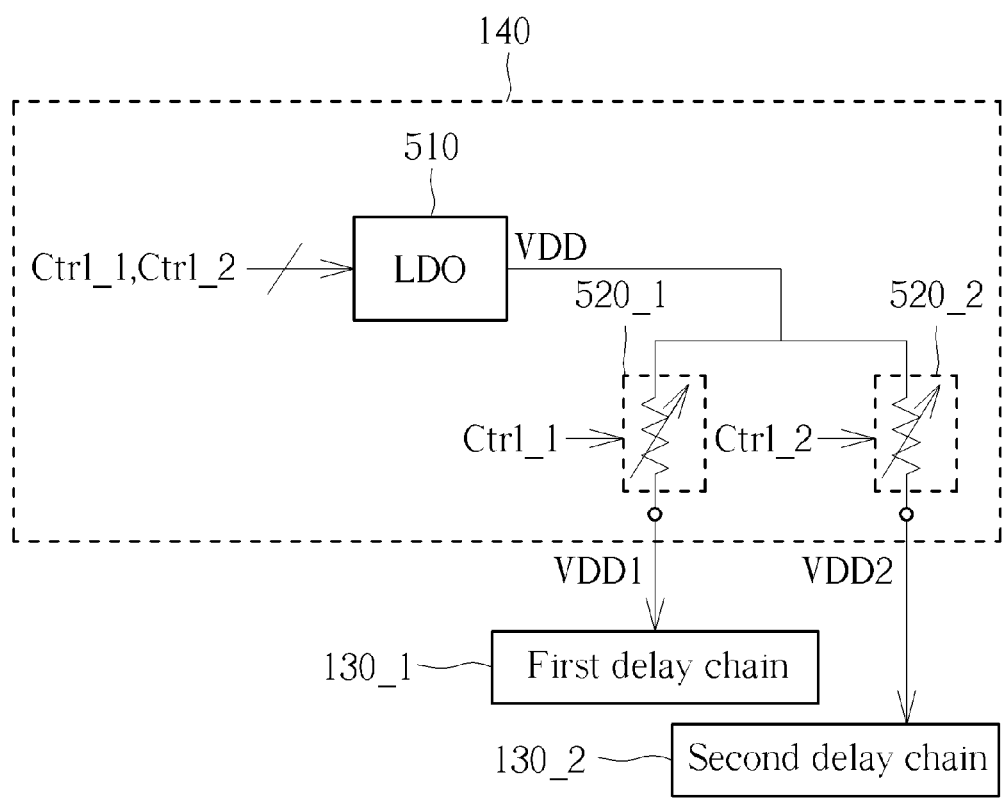
FIG. 5 is a diagram illustrating the delay control according to a first embodiment of the present invention.

Please refer to FIG. 5, which is a diagram illustrating the calibration circuit 140 according to another embodiment of the present invention. In FIG. 5, the calibration circuit 140 further comprises a low dropout regulator (LDO) 510 and two variable resistors 520_1 and 520_2. As shown in FIG. 5, the LDO 510 receives the digital calibration signals Ctrl_1 and Ctrl_2 generated from the circuits shown in FIG. 4, and to coarse tune a supply voltage VDD; and a resistance of the variable resistor 520_1 is controlled by the digital calibration signal Ctrl_1 to fine tune the supply voltage VDD to generate a first supply voltage VDD1 to the first delay chain 130_1; and a resistance of the variable resistor 520_2 is controlled by the digital calibration signal Ctrl_2 to fine tune the supply voltage VDD to generate a second supply voltage VDD2 to the second delay chain 130_2. In light of above, by controlling/adjusting the supply voltages of the first delay chain 130_1 and the second delay chain 130_2 (i.e. adjusting the supply voltages of the inverters 210_1-210_6 and 220_1-220_6), the delay amount of inverters 210_1-210_6 and 220_1-220_6 can be adjusted to make sure that the outputs Vout<4>, Vout<6>, Vout<0> and Vout<2> (i.e. I+, Q+, I-, Q-) have the accurate phases.

In addition, in the embodiment shown in FIGS. 4 and 5, two digital calibration signals Ctrl_1 and Ctrl_2 are generated to control the delay amounts of the first delay chain 130_1 and the second delay chain 130_2, respectively. In another embodiment, however, the calibration circuit 130 can generate only one digital calibration signal to control the delay amounts of the first delay chain 130_1 and the second delay chain 130_2. For example, both the first delay chain 130_1 and the second delay chain 130_2 may be supplied by the same supply voltage VDD outputted by the LDO 510.

Figure 6:
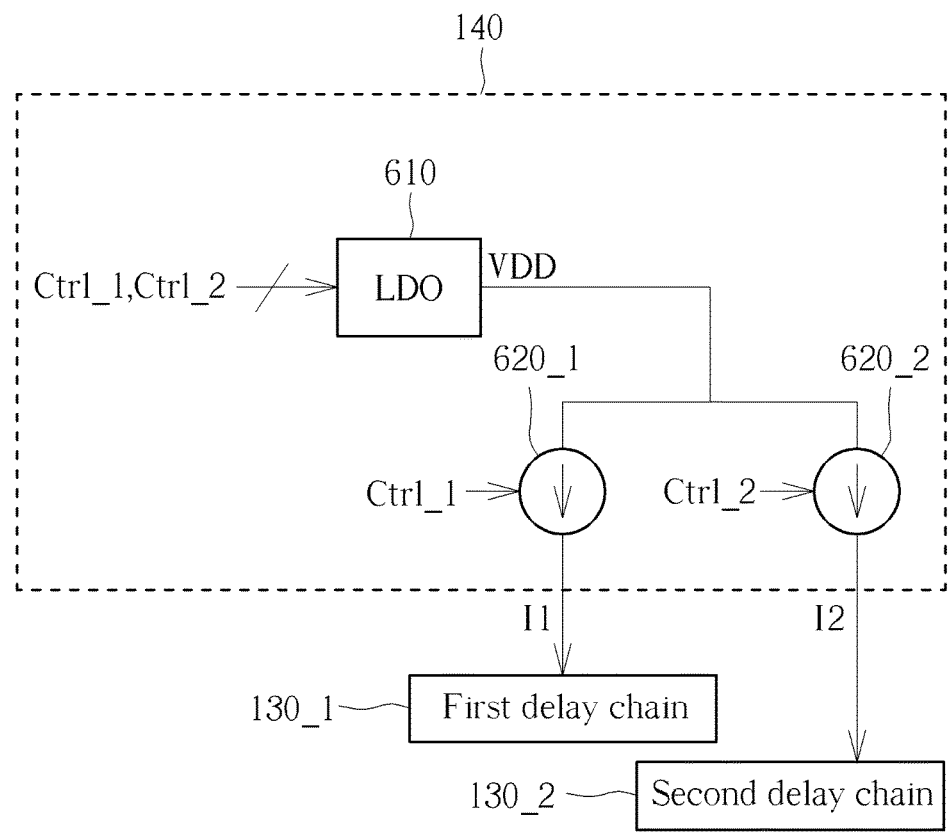
FIG. 6 is a diagram illustrating the delay control according to a second embodiment of the present invention.

Please refer to FIG. 6, which is a diagram illustrating the calibration circuit 140 according to another embodiment of the present invention. In FIG. 6, the calibration circuit 140 further comprises an LDO 610 and two current sources 620_1 and 620_2 (in this embodiment, current sources 620_1 and 620_2 may be the proportional to absolute temperature (PTAT) current sources or complementary to absolute temperature (CTAT) current sources). As shown in FIG. 6, the LDO 610 receives the digital calibration signals Ctrl_1 and Ctrl_2 generated from the circuits shown in FIG. 4, and to coarse tune a supply voltage VDD; and the current source 620_1 is controlled by the digital calibration signal Ctrl_1 to generate a first current I1 to the first delay chain 130_1; and the current source 620_2 is controlled by the digital calibration signal Ctrl_2 to generate a second current I2 to the second delay chain 130_2. In light of above, by controlling/adjusting the currents of the first delay chain 130_1 and the second delay chain 130_2 (i.e. adjusting the currents I1 and I2 flowing through of the inverters 210_1-210_6 and 220_1-220_6, respectively), the delay amount of inverters 210_1-210_6 and 220_1-220_6 can be adjusted to make sure that the outputs Vout<4>, Vout<6>, Vout<0> and Vout<2> (i.e. I+, Q+, I-, Q-) have the accurate phases.

Figure 7:
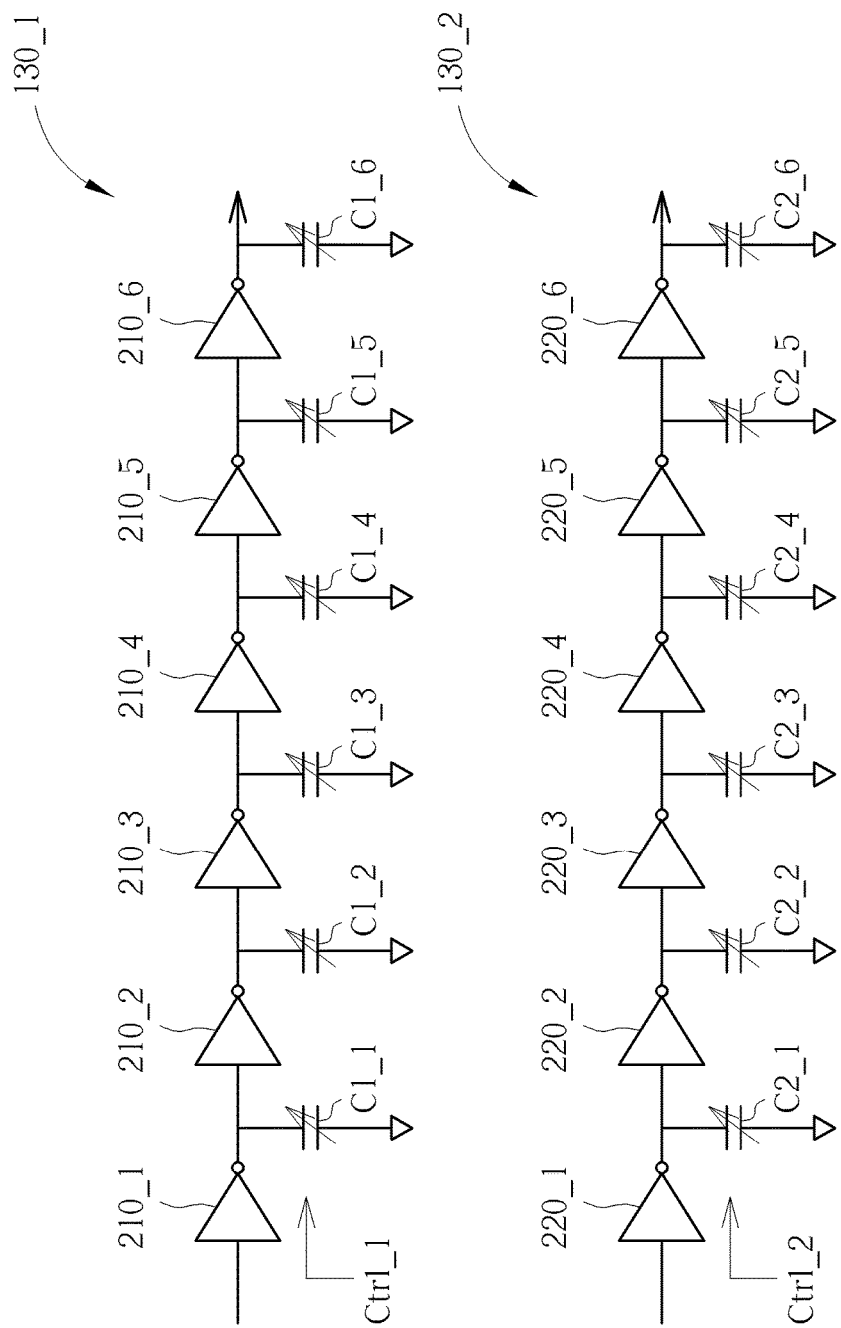
FIG. 7 is a diagram illustrating the delay control according to a third embodiment of the present invention.

Please refer to FIG. 7, which is a diagram illustrating the delay control according to another embodiment of the present invention. As shown in FIG. 4 and FIG. 7, the loads of the inverters 210_1-210_6 can be controlled by the digital calibration signal Ctrl_1 to determine the delay amount of the inverters 210_1-210_6 within the first delay chain 130_1; and the loads of the inverters 220_1-220_6 can be controlled by the digital calibration signal Ctrl_2 to determine the delay amount of the inverters 220_1-220_6 within the second delay chain 130_2. In this embodiment, a plurality of variable capacitors C1_1-C1_6 are coupled to the output nodes of the inverters 210_1-210_6, and the plurality of variable capacitors C2_1-C2_6 are coupled to the output nodes of the inverters 220_1-220_6, and the capacitances of the variable capacitors C1_1-C1_6 and C2_1-C2_6 are controlled/adjusted by the digital calibration signals Ctrl_1 and Ctrl_2, respectively. In this embodiment, without a limitation of the present invention, the variable capacitors C1_1-C1_6 are controlled by the same digital calibration signal Ctrl_1 to have the same capacitance, and the variable capacitors C2_1-C2_6 are controlled by the same digital calibration signal Ctrl_2 to have the same capacitance.

In another embodiment, each of the variable capacitors C1_1-C1_6 and C2_1-C2_6 shown in FIG. 7 can be replaced by a variable resistor, and the calibration circuit 140 may generate the digital control signals Ctrl_1 and Ctrl_2 to control/adjust the resistances of the variable resistors to determine the delay amounts of the inverters 210_1-210_6 and 220_1-220_6.

Figure 8:
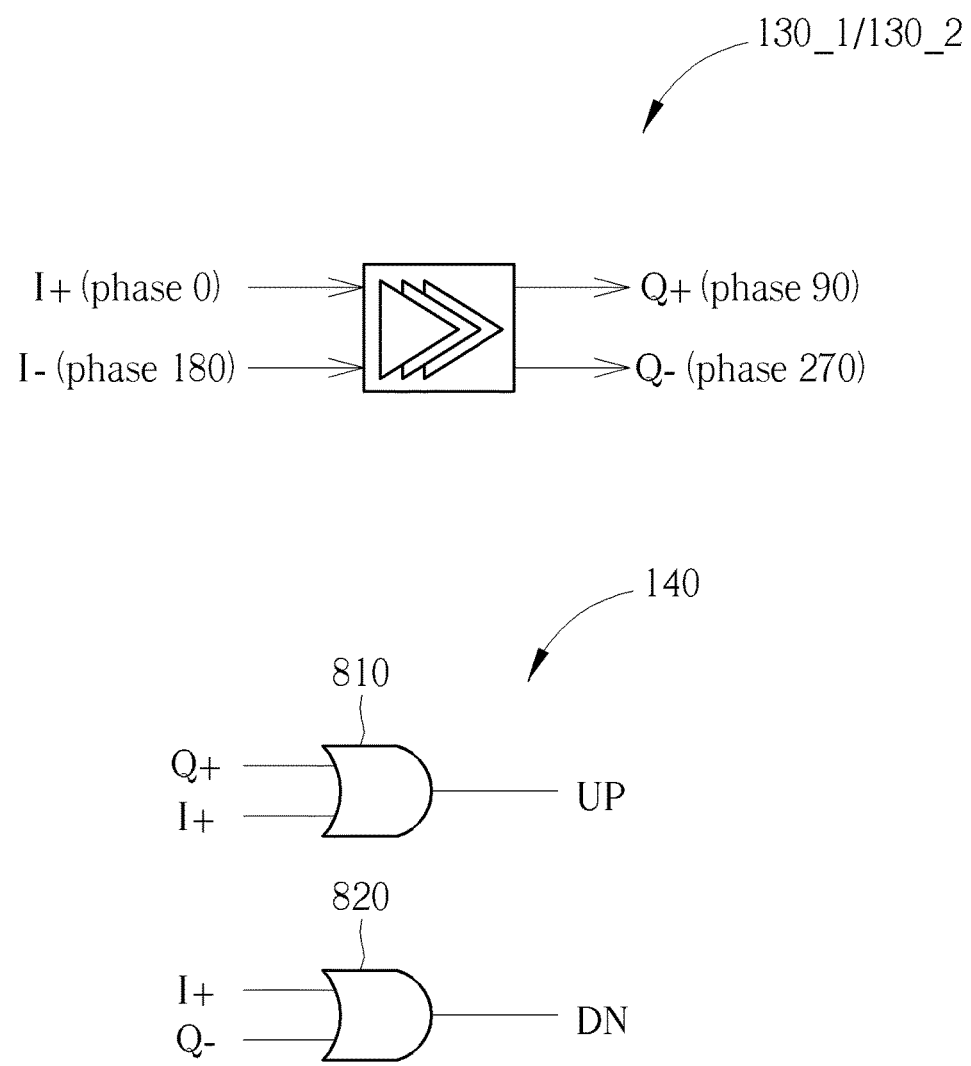
FIG. 8 is a diagram illustrating the calibration circuit according to another embodiment of the present invention.
Figure 9:
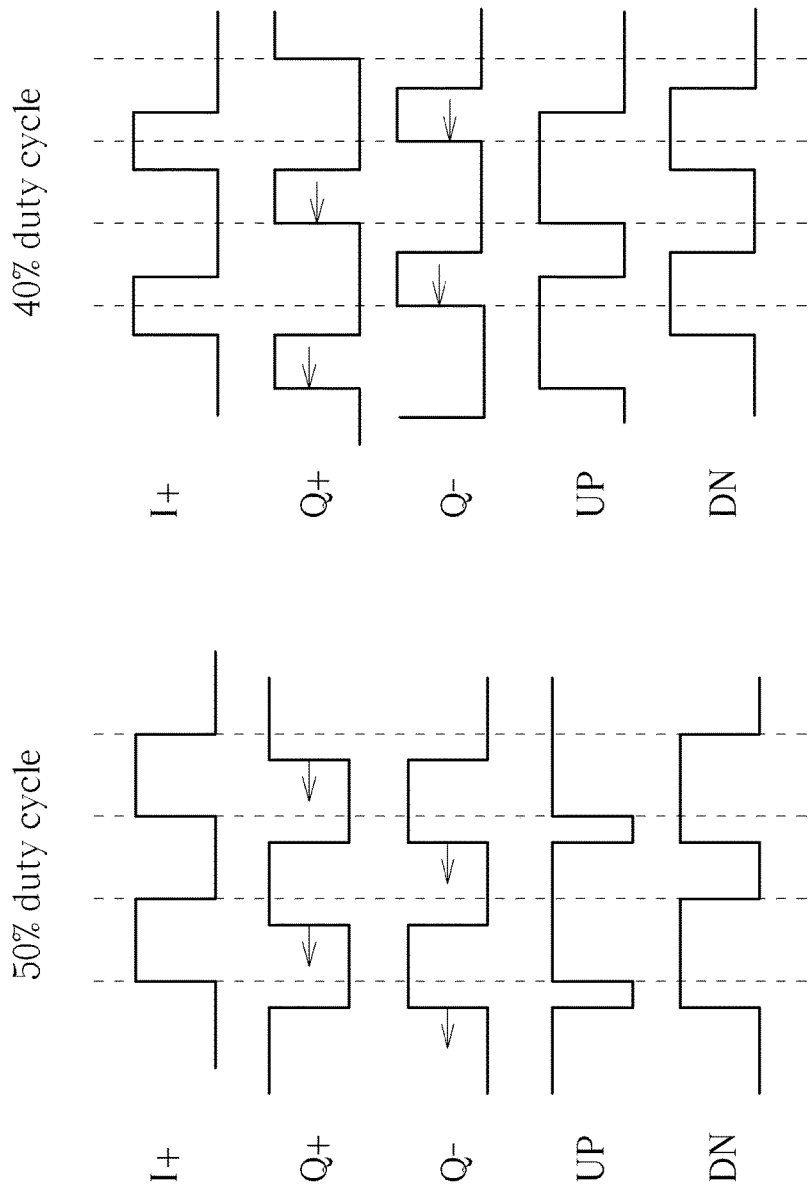
FIG. 9 shows the timing diagram of the signals.

In another embodiment, please refer to FIG. 8, which is a diagram illustrating the calibration circuit 140 according to another embodiment of the present invention, where the calibration circuit 140 comprises two OR gates 810 and 820. As shown in FIG. 8, the OR gate 810 receives the in-phase signal (I+) and the quadrature signal (Q+) to generate a control signal UP, and the OR gate 820 receives the in-phase signal (I+) and the inverted quadrature signal (Q−) to generate a control signal DN. In this embodiment, the in-phase signal (I+), the quadrature signal (Q+) and the inverted quadrature signal (Q−) can be the signals Vout_D4, Vout<6> and Vout<2> shown in FIG. 2. The calibration circuit 140 shown in FIG. 8 can be regarded as a 90 degree phase detector independent of duty cycle and power, and the control signals UP and DN are used to control the delay amount of the inverters 210_1-210_6 and 220_1-220_6, to make the phase different between the in-phase signal (I+) and the quadrature signal (Q+) close to 90 degree. In detail, please refer to FIG. 9, which shows a timing diagram of the signals I+, Q+, Q−, UP and DN when the duty cycle of the signals I+, Q+, Q−, UP is 40% or 50% according to one embodiment of the present invention. As shown in FIG. 9, the control signal UP represents that the quadrature signal (Q+) and the inverted quadrature signal (Q−) should be delayed more, and the control signal DN represents that the quadrature signal (Q+) and the inverted quadrature signal (Q−) should has less delay amount. In this embodiment, because the enabling period of the control signal UP is greater than the enabling period of the control signal DN, overall, the calibration circuit 140 may increase the delay amount of the inverters 210_1-210_6 and 220_1-220_6 to make the quadrature signal (Q+) and the inverted quadrature signal (Q−) close to 90 degree and 270 degree, respectively.

Figure 10:
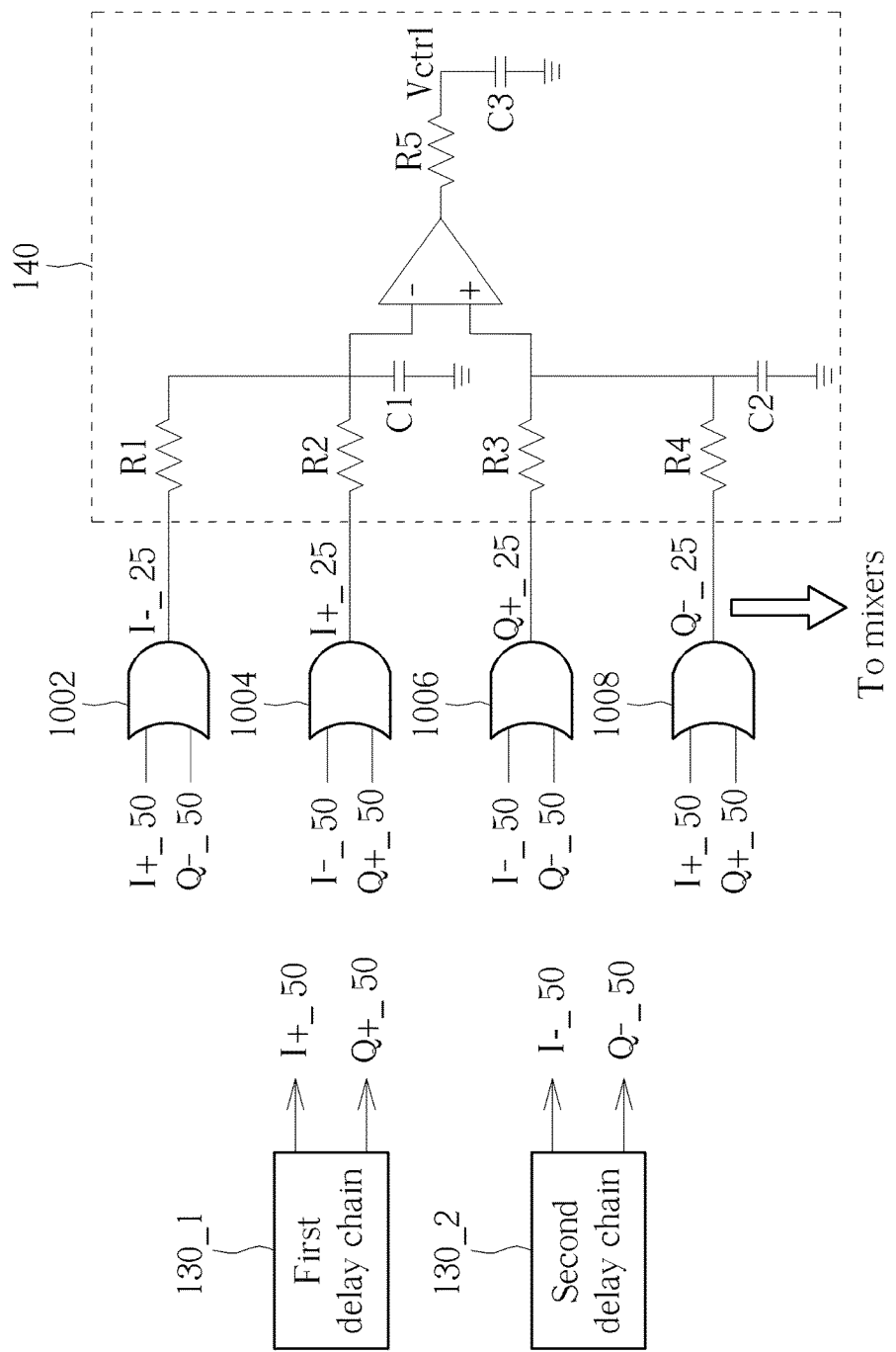
FIG. 10 is a diagram illustrating the calibration circuit according to another embodiment of the present invention.

Please refer to FIG. 10, which is a diagram illustrating the calibration circuit 140 according to another embodiment of the present invention. As shown in FIG. 10, the calibration circuit 140 comprises resistors R1-R5, capacitors C1-C3 and an operational amplifier 1010. In this embodiment, the first delay chain 130_1 and the second delay chain 130_2 generate the in-phase signal I+_50, the quadrature signal Q+_50, the inverted in-phase signal I−_50 and the inverted quadrature signal Q−_50 with 50% duty cycle; and a logic circuit comprising four AND gates 1002, 1004, 1006 and 1008 are used to generate the in-phase signal I+_25, the quadrature signal Q+_25, the inverted in-phase signal I−_25 and the inverted quadrature signal Q−_25 with 25% duty cycle to mixers according to the signals I+_50, Q+_50, I−_50 and Q−_50; and the operational amplifier 1010 compares a summation of the signals I+_25 and I−_25 with a summation of the signals Q+_25 and Q−_25 to generate a control signal Vctrl to control the delay amount of the inverters 210_1-210_6 and 220_1-220_6 to make the signals I+_25, I−_25, Q+_25 and Q−_25 to have accurate phases.

Figure 11:
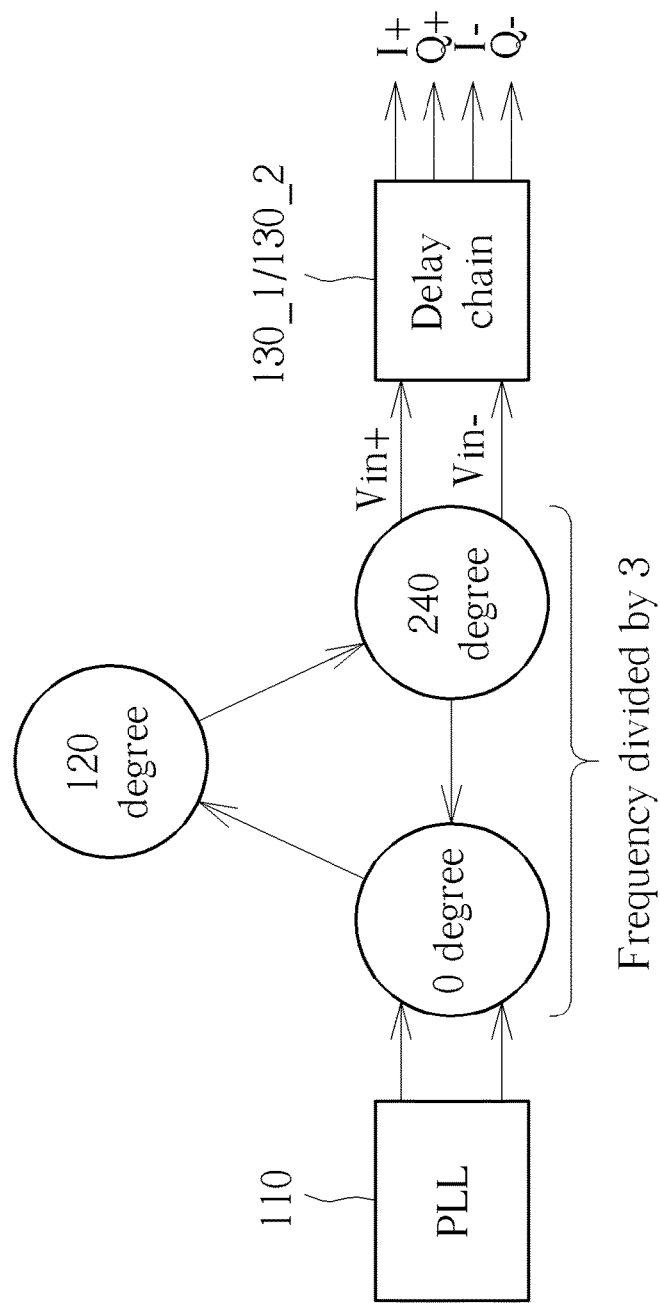
FIG. 11 shows a concept corresponding to the embodiment shown in FIG. 1.

Briefly summarized, FIG. 11 shows a concept corresponding to the embodiment shown in FIG. 1, in the embodiments of the present invention, oscillating signals with different phases (e.g. quadrature outputs I+, I−, Q+, Q−) can be generated when an odd number frequency divider is applied into the local oscillator, and the delay chains and the calibration circuit have efficient designs to make sure the phases of the oscillating signals are accurate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for generating a plurality of oscillating signals with different phases, comprising:
 a frequency divider, for frequency dividing a first input signal and a second input signal to generate a first frequency-divided input signal and a second frequency-divided input signal, wherein the first input signal and the second input signal have different phases;
 a first delay chain comprising a plurality of first delay cells connected in series, for receiving the first frequency-divided input signal;
 a second delay chain comprising a plurality of second delay cells connected in series, for receiving the second frequency-divided input signal; and
 a calibration circuit, coupled to the first delay chain and the second delay chain, for controlling delay amounts of the first delay chain and the second delay chain according to signals within the first delay chain or the second delay chain;
 wherein output signals of a portion of the first delay cells and the second delay cells serve as the plurality of oscillating signals with different phases; and the frequency divider has an odd divisor, and the plurality of oscillating signals are an in-phase signal, a quadrature signal, an inverted in-phase signal and an inverted quadrature signal.

2. The circuit of claim 1, wherein the output signals of two of the first delay cells serve as two of the in-phase signal, the quadrature signal, the inverted in-phase signal and the inverted quadrature signal, and the output signals of two of the second delay cells serve as the other two of the in-phase signal, the quadrature signal, the inverted in-phase signal and the inverted quadrature signal.

3. The circuit of claim 1, wherein each of the first delay cells and the second delay cells is an inverter.

4. The circuit of claim 1, wherein the calibration circuit controls the delay amounts of the first delay chain and the second delay chain by controlling a supply voltage of the first delay chain and the second delay chain.

5. The circuit of claim 4, wherein the calibration circuit generates two calibration signals to control a first supply voltage of the first delay chain and a second supply voltage of the second delay chain, respectively, to control the delay amounts of the first delay chain and the second delay chain.

6. The circuit of claim 1, wherein the calibration circuit controls the delay amounts of the first delay chain and the second delay chain by controlling currents of the first delay chain and the second delay chain.

7. The circuit of claim 1, wherein the calibration circuit controls the delay amounts of the first delay chain and the second delay chain by controlling loads of the first delay chain and the second delay chain.

8. The circuit of claim 1, wherein the calibration circuit generates at least one digital calibration signal to control the delay amounts of the first delay chain and the second delay chain.

9. The circuit of claim 8, wherein the calibration circuit comprises
a logic circuit, for receiving part of the output signals of the first delay cells within the first delay chain and/or part of the output signals of the second delay cells within the second delay chain;
a low-pass filter, for filtering an output of the logic circuit to generate a filtered signal; and
an analog-to-digital converter, for converting the filtered signal to generate the at least one digital calibration signal.

10. A method for generating a plurality of oscillating signals with different phases, comprising:
frequency dividing a first input signal and a second input signal to generate a first frequency-divided input signal and a second frequency-divided input signal, wherein the first input signal and the second input signal have different phases;
using a plurality of first delay cells connected in series to delay the first frequency-divided input signal;
using a plurality of second delay cells connected in series to delay the second frequency-divided input signal;
controlling delay amounts of the first delay cells and the second delay cells according to at least two outputs of the first delay cells or the second delay cells; and
outputting output signals of a portion of the first delay cells and the second delay cells to serve as the plurality of oscillating signals with different phases;
wherein the frequency dividing operation has an odd divisor, and the plurality of oscillating signals are an in-phase signal, a quadrature signal, an inverted in-phase signal and an inverted quadrature signal.

11. The method of claim 10, wherein output signals of two of the first delay cells serve as two of the in-phase signal, the quadrature signal, the inverted in-phase signal and the inverted quadrature signal, and outputs of two of the second delay cells serve as the other two of the in-phase signal, the quadrature signal, the inverted in-phase signal and the inverted quadrature signal.

12. The method of claim 10, wherein each of the first delay cells and the second delay cells is implemented by an inverter.

13. The method of claim 10, wherein the step of controlling the delay amounts of the first delay cells and the second delay cells comprises:
controlling the delay amounts of the first delay cells and the second delay cells by controlling a supply voltage of the first delay cells and the second delay cells.

14. The method of claim 13, wherein the step of controlling the delay amounts of the first delay cells and the second delay cells comprises:
generating two calibration signals to control a first supply voltage of the first delay cells and a second supply voltage of the second delay cells, respectively, to control the delay amounts of the first delay cells and the second delay cells.

15. The method of claim 10, wherein the step of controlling the delay amounts of the first delay cells and the second delay cells comprises:
controlling the delay amounts of the first delay cells and the second delay cells by controlling currents of the first delay cells and the second delay cells.

16. The method of claim 10, wherein the step of controlling the delay amounts of the first delay cells and the second delay cells comprises:
controlling the delay amounts of the first delay cells and the second delay cells by controlling loads of the first delay cells and the second delay cells.

17. The method of claim 10, wherein the step of controlling the delay amounts of the first delay cells and the second delay cells comprises:
generating at least one digital calibration signal to control the delay amounts of the first delay cells and the second delay cells.

18. A circuit for generating a plurality of oscillating signals with different phases, comprising:
a frequency divider, for frequency dividing a first input signal and a second input signal to generate a first frequency-divided input signal and a second frequency-divided input signal, wherein the first input signal and the second input signal have different phases;
a first delay chain comprising a plurality of first delay cells connected in series, for receiving the first frequency-divided input signal;
a second delay chain comprising a plurality of second delay cells connected in series, for receiving the second frequency-divided input signal; and
a calibration circuit, coupled to the first delay chain and the second delay chain, for controlling delay amounts of the first delay chain and the second delay chain according to signals within the first delay chain or the second delay chain;
wherein output signals of a portion of the first delay cells and the second delay cells serve as the plurality of oscillating signals with different phases;
wherein the calibration circuit controls the delay amounts of the first delay chain and the second delay chain by controlling a supply voltage of the first delay chain and the second delay chain, and the calibration circuit generates two calibration signals to control a first supply voltage of the first delay chain and a second supply voltage of the second delay chain, respectively, to control the delay amounts of the first delay chain and the second delay chain.

19. The circuit of claim 18, wherein the frequency divider has an odd divisor, and the plurality of oscillating signals are an in-phase signal, a quadrature signal, an inverted in-phase signal and an inverted quadrature signal.

20. The circuit of claim 19, wherein the output signals of two of the first delay cells serve as two of the in-phase signal, the quadrature signal, the inverted in-phase signal and the inverted quadrature signal, and the output signals of two of the second delay cells serve as the other two of the in-phase signal, the quadrature signal, the inverted in-phase signal and the inverted quadrature signal.

21. A circuit for generating a plurality of oscillating signals with different phases, comprising:
- a frequency divider, for frequency dividing a first input signal and a second input signal to generate a first frequency-divided input signal and a second frequency-divided input signal, wherein the first input signal and the second input signal have different phases;
- a first delay chain comprising a plurality of first delay cells connected in series, for receiving the first frequency-divided input signal;
- a second delay chain comprising a plurality of second delay cells connected in series, for receiving the second frequency-divided input signal; and
- a calibration circuit, coupled to the first delay chain and the second delay chain, for controlling delay amounts of the first delay chain and the second delay chain according to signals within the first delay chain or the second delay chain;
- wherein output signals of a portion of the first delay cells and the second delay cells serve as the plurality of oscillating signals with different phases; and the calibration circuit controls the delay amounts of the first delay chain and the second delay chain by controlling currents of the first delay chain and the second delay chain.

22. The circuit of claim 21, wherein the frequency divider has an odd divisor, and the plurality of oscillating signals are an in-phase signal, a quadrature signal, an inverted in-phase signal and an inverted quadrature signal.

23. The circuit of claim 22, wherein the output signals of two of the first delay cells serve as two of the in-phase signal, the quadrature signal, the inverted in-phase signal and the inverted quadrature signal, and the output signals of two of the second delay cells serve as the other two of the in-phase signal, the quadrature signal, the inverted in-phase signal and the inverted quadrature signal.

24. A circuit for generating a plurality of oscillating signals with different phases, comprising:
- a frequency divider, for frequency dividing a first input signal and a second input signal to generate a first frequency-divided input signal and a second frequency-divided input signal, wherein the first input signal and the second input signal have different phases;
- a first delay chain comprising a plurality of first delay cells connected in series, for receiving the first frequency-divided input signal;
- a second delay chain comprising a plurality of second delay cells connected in series, for receiving the second frequency-divided input signal; and
- a calibration circuit, coupled to the first delay chain and the second delay chain, for controlling delay amounts of the first delay chain and the second delay chain according to signals within the first delay chain or the second delay chain;
- wherein output signals of a portion of the first delay cells and the second delay cells serve as the plurality of oscillating signals with different phases;
- wherein the calibration circuit generates at least one digital calibration signal to control the delay amounts of the first delay chain and the second delay chain, and the calibration circuit comprises
- a logic circuit, for receiving part of the output signals of the first delay cells within the first delay chain and/or part of the output signals of the second delay cells within the second delay chain;
- a low-pass filter, for filtering an output of the logic circuit to generate a filtered signal; and
- an analog-to-digital converter, for converting the filtered signal to generate the at least one digital calibration signal.

25. The circuit of claim 24, wherein the frequency divider has an odd divisor, and the plurality of oscillating signals are an in-phase signal, a quadrature signal, an inverted in-phase signal and an inverted quadrature signal.

26. The circuit of claim 25, wherein the output signals of two of the first delay cells serve as two of the in-phase signal, the quadrature signal, the inverted in-phase signal and the inverted quadrature signal, and the output signals of two of the second delay cells serve as the other two of the in-phase signal, the quadrature signal, the inverted in-phase signal and the inverted quadrature signal.

* * * * *